(12) United States Patent
Chiang

(10) Patent No.: US 8,542,777 B2
(45) Date of Patent: Sep. 24, 2013

(54) AMPLITUDE MODULATION DEMODULATING CIRCUIT AND METHOD THEREOF

(75) Inventor: Chien-Shan Chiang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 360 days.

(21) Appl. No.: 12/985,405

(22) Filed: Jan. 6, 2011

(65) Prior Publication Data

US 2011/0164704 A1 Jul. 7, 2011

(30) Foreign Application Priority Data

Jan. 7, 2010 (TW) .............................. 99100222 A

(51) Int. Cl.
*H03D 1/00* (2006.01)
*H04L 27/06* (2006.01)
(52) U.S. Cl.
USPC ........................... 375/320; 375/340; 329/353
(58) Field of Classification Search
USPC ................ 375/320, 340; 329/347, 349, 353
See application file for complete search history.

(56) References Cited

U.S. PATENT DOCUMENTS

| | | | | |
|---|---|---|---|---|
| 4,393,352 A | * | 7/1983 | Volpe et al. | 329/349 |
| 6,025,754 A | * | 2/2000 | Czora | 330/296 |
| 2004/0207763 A1 | * | 10/2004 | Ciardi | 348/723 |
| 2006/0028342 A1 | * | 2/2006 | Choi et al. | 340/572.1 |

* cited by examiner

*Primary Examiner* — David B. Lugo
(74) *Attorney, Agent, or Firm* — Edell, Shapiro & Finnan, LLC

(57) ABSTRACT

An amplitude modulation (AM) demodulating circuit applied to a radio frequency identification (RFID) system attenuates carrier signals by a notch filter to increase a signal-to-carrier ratio and to reduce complexity and cost of circuit design. The AM demodulating circuit includes an envelope detector, a notch filter, a low-pass filter, and a comparing circuit. The envelope detector performs envelope detection on an AM signal modulated by a carrier frequency to generate an envelope signal. The notch filter filters the envelope signal to generate a first filtered signal, and a zero point of the notch filter corresponds to the carrier frequency of the AM signal. The low-pass filter filters the first filtered signal to generate a second filtered signal, and the carrier frequency of the AM signal corresponds to a stop band of the low-pass filter. The comparing circuit converts the second filtered signal to a digital signal according to a level value.

14 Claims, 5 Drawing Sheets

AMPLITUDE MODULATION DEMODULATING CIRCUIT AND METHOD THEREOF

CROSS REFERENCE TO RELATED PATENT APPLICATION

This patent application is based on Taiwan, R.O.C. patent application No. 099100222 filed on Jan. 7, 2010.

FIELD OF THE INVENTION

The present invention relates to demodulation of amplitude modulation (AM), and more particularly, to an AM demodulating circuit and method thereof applied to a radio frequency identification (RFID) system.

BACKGROUND OF THE INVENTION

Amplitude modulation (AM) is a common modulation technique, and for a digital communication system, amplitude shift keying (ASK) is a common AM technique. For example, an RFID system employs the ASK technique to modulate and demodulate transmission data. When AM is performed, a to-be-transmitted baseband data signal is modulated by a carrier signal to generate an AM signal, and amplitude of the AM signal represents the transmission data. For example, when the transmission data are digital data, low amplitude represents a digital "0", and high amplitude represents a digital "1". In the AM technique, carrier signals are often sources of noises, and thus a signal-to-carrier ratio needs to be increased to gain better demodulation effect when the AM signal is demodulated.

In the prior art, when the AM signal is demodulated, an all-poles low-pass filter is applied to pass baseband data signals and simultaneously attenuate high-frequency (HF) carrier signals thereby increasing the signal-to-carrier ratio. When a frequency of the data signal is far lower than a carrier frequency, only a low-stage low-pass filter is needed to gain an acceptable effect. However, when the frequency of the data signal is increased, i.e., a data rate of the communication system is increased, a difference between the frequency of the data signal and the carrier frequency is reduced. In particular, in a communication system having a low carrier frequency, e.g., a low-frequency (LF) or an HF RFID system, the difference between the frequency of the data signal and the carrier frequency will be further reduced when the data rate is increased. Under such a situation, the low-pass filter having a higher stage is needed to pass the data signal and simultaneously attenuate carrier signals. However, complexity and cost of circuit design are accordingly increased.

For example, FIG. 1 shows frequency response of a single-pole low-pass filter, where a horizontal axis represents frequency and a vertical axis represents a gain value. Supposing that a carrier frequency fc is 4 times of a baseband frequency fs, which is equal to a cutoff frequency corresponding to a gain value of −3 dB of the single-pole low-pass filter. Since a stop band of the single-pole low-pass filter has a slope of −20 dB/decade, the carrier frequency corresponds to a gain value of −12 dB. Assume an n-stage all-poles low-pass filter is needed to achieve a signal-to-carrier ratio R that is higher than 30 dB. Accordingly, the signal-to-carrier ratio R can be represented as Formula 1:

$$R = n*(-3\ \text{dB}) - n*(-12\ \text{dB}) > 30\ \text{dB} \quad (1)$$

Accordingly, it is obtained that n≥4, i.e., a 4-stage all-poles low-pass filter is needed to achieve the signal-to-carrier ratio R that is higher than 30 dB. However, complexity and cost of circuit design are accordingly substantially increased.

SUMMARY OF THE INVENTION

In view of the foregoing issues, one object of the present invention is to provide an AM demodulating circuit and method thereof, which are applied to an RFID system and are capable of suppressing noise near the carrier frequency of the AM signal by a notch filter, so as to increase a signal-to-carrier ratio and reduce complexity and cost of circuit design.

According to an embodiment of the invention, an AM demodulating circuit comprises an envelope detector, for performing envelope detection on an AM signal modulated by a carrier frequency to generate an envelope signal; a notch filter, for filtering the envelope signal to suppress noise near the carrier frequency of the AM signal thereby generating a first filtered signal; a low-pass filter, for filtering the first filtered signal to generate a second filtered signal; and a comparing circuit, for converting the second filtered signal to a digital signal according to a level value.

According to another embodiment of the invention, an AM demodulating method comprises performing envelope detection on an AM signal modulated by a carrier frequency to generate an envelope signal; filtering the envelop signal by a notch filter to suppress noise near the carrier frequency of the AM signal thereby generating a first filtered signal; filtering the first filtered signal by a low-pass filter to generate a second filtered signal; and converting the second filtered signal to a digital signal according to a level value.

DETAILED DESCRIPTION OF THE PREFERRED EMBODIMENT

Figure 2:
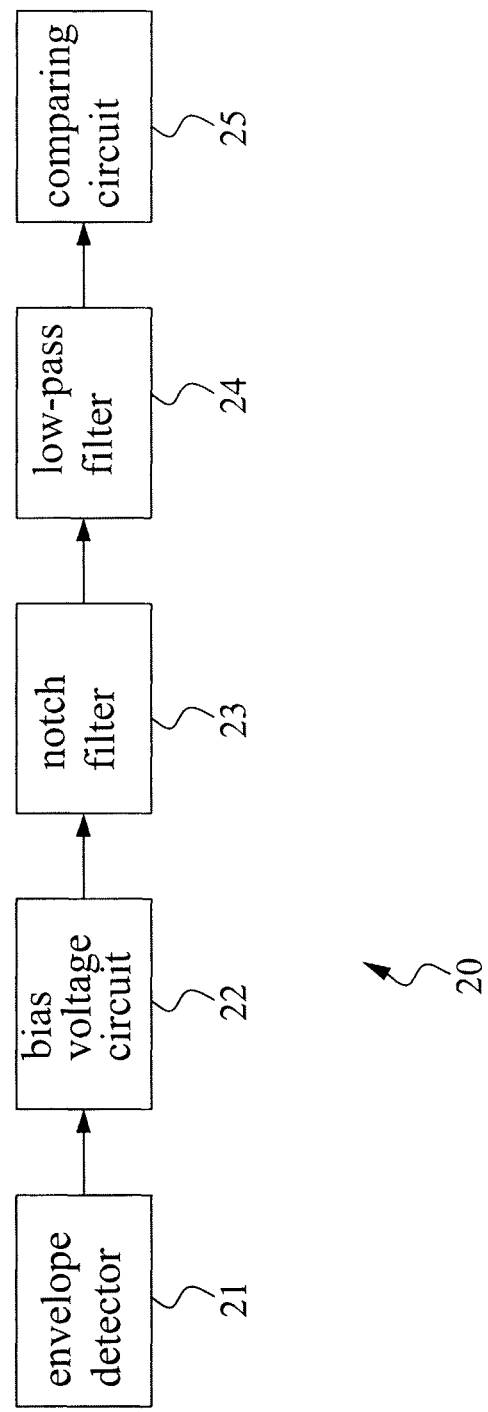
FIG. 2 is a block diagram of an AM demodulating circuit in accordance with an embodiment of the present invention.

FIG. 2 is a block diagram of an AM demodulating circuit in accordance with an embodiment of the present invention. An AM demodulating circuit 20 comprises an envelope detector 21, a bias voltage circuit 22, a notch filter 23, a low-pass filter 24, and a comparing circuit 25. The AM demodulating circuit 20 demodulates a received AM signal, e.g., an ASK signal modulated by the ASK technique. The AM demodulating circuit 20, which is capable of increasing a signal-to-carrier ratio with a simple and effective approach, is applicable to a communication system having a not-too-large difference between a baseband frequency and a carrier frequency. For example, when an RFID system applying the ASK technique needs to increase its data rate, a difference between a baseband frequency and a carrier frequency of an RFID system will be reduced. In particular, within a low-frequency (LF) or high-frequency (HF) RFID system, since the carrier frequency is already low, the difference between the baseband frequency and the carrier frequency of the RFID signal is further reduced when increasing the transmission data rate. More specifically, when the baseband frequency is increased from 848 Kbps (i.e., 1/16 of the carrier frequency) to four multiples as 3.39 Mbps (i.e., 1/4 of the carrier frequency), the baseband frequency extremely approximates the carrier frequency, such that the signal-to-carrier ratio of the RFID signal can be effectively increased by the AM demodulating circuit 20.

The envelope detector 21 performs envelope detection on the AM signal modulated by a carrier frequency to generate an envelope signal. The bias-voltage circuit 22 coupled to the envelope detector 21 adjusts a direct-current (DC) bias voltage of the envelope signal, so as to set the envelope signal (i.e., have the signal lay) within an operating voltage range of the notch filter 23 as well as to assist the envelope signal to be not beyond an operating voltage range of the low-pass filter 24 during subsequent amplifying and filtering processing of the low-pass filter 24. For example, the bias-voltage circuit 22 can first remove original DC components of the envelope signal by an alternating-current (AC) coupler (not shown) and then perform appropriate bias voltage processing.

Figure 3:
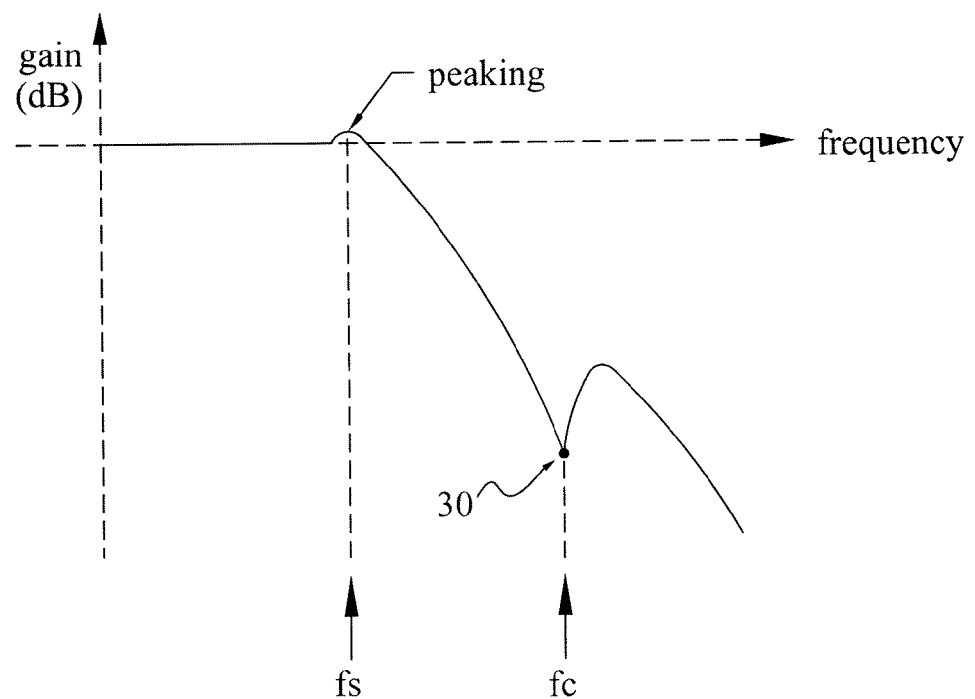
FIG. 3 is a schematic diagram of the frequency response of the notch filter in FIG. 2 in accordance with an embodiment of the present invention.

The notch filter 23 coupled to the bias-voltage circuit 22 filters the bias-voltage adjusted envelope signal to suppress noise near the carrier frequency and thereby generate a first filtered signal. FIG. 3 shows the frequency response of the notch filter 23. A zero point 30 of the notch filter 23 is designed to correspond to the carrier frequency fc of the AM signal, and such that a baseband frequency fs corresponding to the AM signal (i.e., a frequency of a data signal contained in the AM signal) is within a pass band of the notch filter 23. Therefore, when performing the filtering, the notch filter 23 passes baseband frequency components of the envelope signal, and substantially attenuates carrier frequency components of the envelope signal, thereby significantly increasing the signal-to-carrier ratio.

Figure 4:
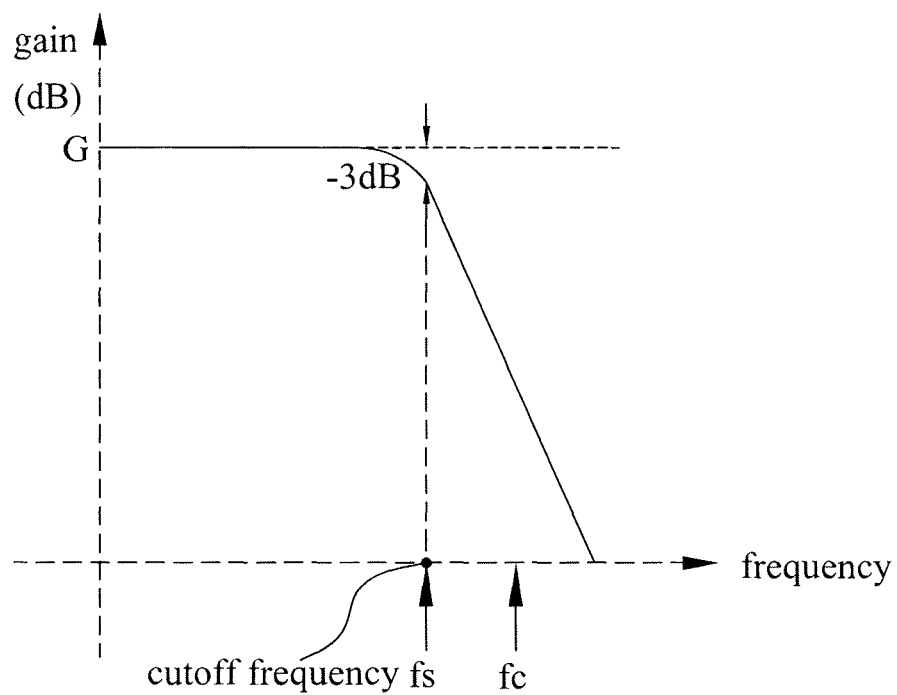
FIG. 4 is a schematic diagram of the frequency response of the low-pass filter in FIG. 2 in accordance with an embodiment of the present invention.

The low-pass filter 24 filters and amplifies the first filtered signal outputted by the notch filter 23 to generate a second filtered signal. FIG. 4 shows the frequency response of the low-pass filter 24. The carrier frequency fc of the AM signal is within a stop band of the low-pass filter 24, and the baseband frequency fs, corresponding to the AM signal, is within a pass band of the low-pass filter 24. Further, the low-pass filter 24 has a gain value G for amplifying baseband frequency components (i.e., signal components having the frequency fs) of the first filtered signal. Therefore, the low-pass filter 24 passes and amplifies the baseband frequency components of the first filtered signal to further increase the signal-to-carrier ratio. Since the original power of the received AM signal may be weak, a more ideal signal-to-carrier ratio can be achieved by the signal gain value G of the low-pass filter 24. In an embodiment, as shown in FIG. 4, a cutoff frequency of the low-pass filter 24 corresponds to the baseband frequency fs (i.e., a gain value of the low-pass filter 24 corresponding to the baseband frequency fs is G−3 dB), so that a frequency difference between the baseband frequency fs and the carrier frequency fc is within the stop band of the low-pass filter 24 to enlarge a gain value difference between baseband frequency components and carrier frequency components. In this embodiment, as shown in FIG. 3, the baseband frequency fs corresponds to a position of a gain peaking of the pass band of the notch filter 23 to compensate a gain loss of 3 dB for the baseband components to pass the low-pass filter 24.

The comparing circuit 25 coupled to the low-pass filter 24 converts the second filtered signal to a digital signal according to a level value to achieve demodulating the AM signal. For example, when a voltage level of the second filtered signal is larger than the level value, a digital value "1" is outputted; when the voltage level of the second filtered signal is smaller than the level value, a digital value "0" is outputted.

Figure 1:
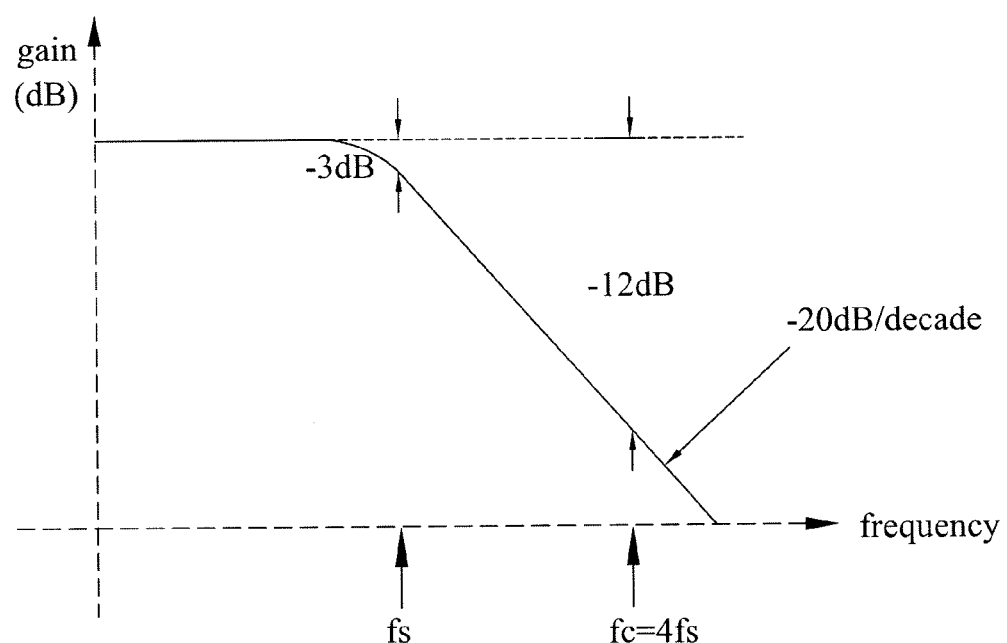
FIG. 1 is a schematic diagram of frequency response of a single-pole low-pass filter.

In the embodiment of FIG. 2, the low-pass filtered 24 can be an all-poles low-pass filter, and the number of stages of the all-poles low-pass filter can be reduced by using the notch filter 23, so as to reduce complexity and cost of circuit design. Taking FIG. 1 as an example, in the prior art, the all-poles low-pass filter having at least four stages is needed to achieve the signal-to-carrier ratio that is higher than 30 dB. However, in the embodiment of FIG. 2, when the notch filter 23 enlarges the gain value difference between the baseband frequency components and the carrier frequency components to 13 dB, the low-pass filter 24 only needs to enlarge the gain value difference between the baseband frequency components and the carrier frequency components to higher than 17 dB, so as to achieve the signal-to-carrier ratio that is higher than 30 dB. In the embodiment of FIG. 2, Formula (1) is modified to:

$$n*(-3\ dB)-n*(-12\ dB)>17\ dB$$

It is accordingly deduced that n≥2 i.e., by adding the notch filter 23, the ASK demodulating circuit in FIG. 2 only needs a two-stage all-poles low-pass filter to achieve a signal-to-carrier ratio that is higher than 30 dB, and thus the complexity and cost of the circuit design can be reduced. For example, when the low-pass filter 24 has two low-pass gain stages, each of the two low-pass gain stages can only apply a single-pole low-pass filter to achieve a desired signal-to-carrier ratio. A person having ordinary skills in the art may design other structures via the notch filter and the low-pas filter according to the foregoing description, e.g., two notch filters and the low-pass filter are applied to achieve the desired signal-to-carrier ratio, and the other structures are also within the scope and sprit of the present invention.

In addition, in the embodiment of FIG. 2, another bias-voltage circuit (not shown) can be disposed between the notch filter 23 and the low-pass filter 24 to adjust the DC bias voltage of the first filtered signal outputted by the notch filter 23, so as to ensure the first filtered signal to be not beyond the operating voltage range of the low-pass filter 24 when the first filtered signal is amplified by the low-pass filter 24 as well as assisting increasing an amplitude range of an AM signal applicable to the AM demodulating circuit 20.

Figure 5:
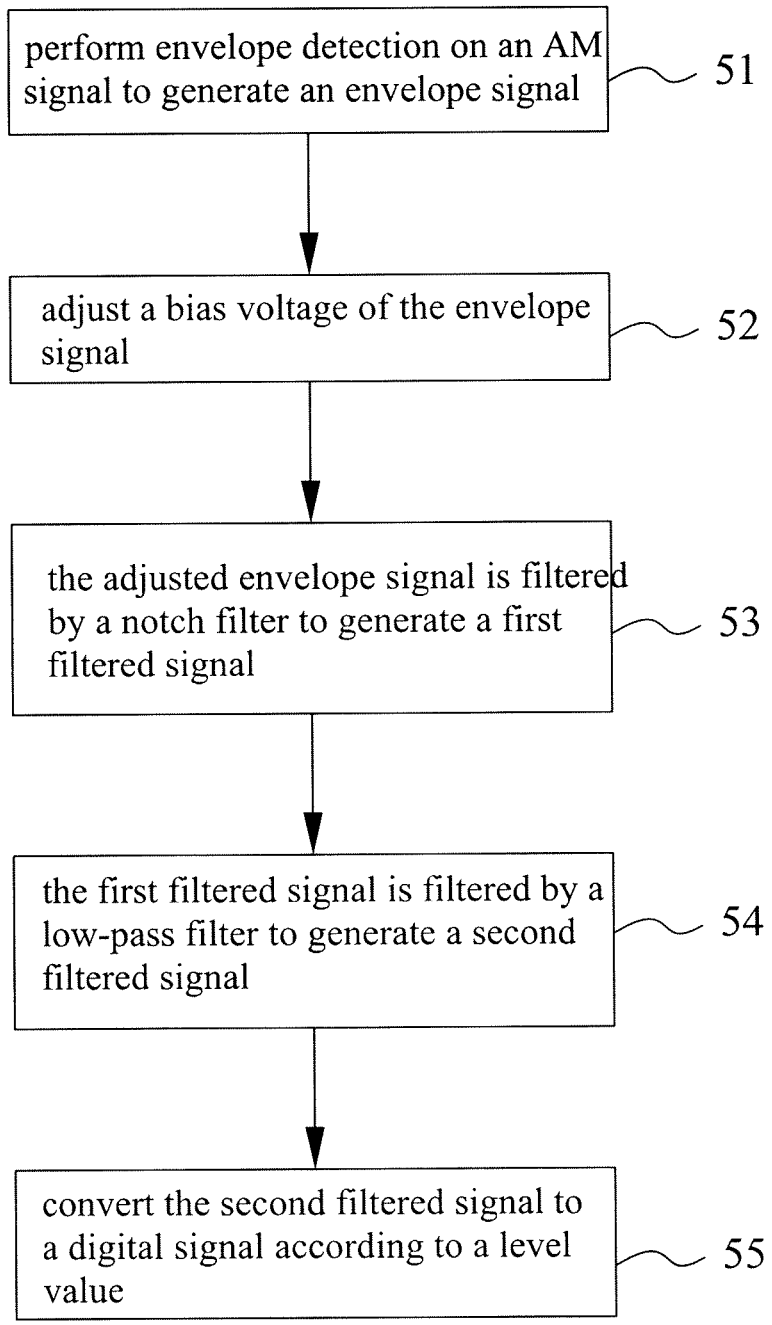
FIG. 5 is a flow chart of an AM demodulating method in accordance with an embodiment of the present invention.

FIG. 5 is a flow chart of an AM demodulating method in accordance with an embodiment of the present invention. In Step 51, envelope detection is performed on an AM signal to generate an envelope signal. The AM signal may be an ASK signal, e.g., an RFID signal. In Step 52, a bias voltage of the envelope signal is adjusted, e.g., DC components of the envelope signal are first removed, and appropriate bias voltage processing is then performed on the filtered envelope signal.

In Step 53, the processed envelope signal is filtered by a notch filter to generate a first filtered signal. A zero point of the notch filter corresponds to a carrier frequency of the AM signal, and a baseband frequency corresponding to the AM signal lies within a pass band of the notch filter.

In Step 54, the first filtered signal is filtered by a low-pass filter to generate a second filtered signal. The carrier frequency of the AM signal lies within a stop band of the low-pass filter, which may be an all-poles low-pass filter. Preferably, a cutoff frequency of the low-pass filter corresponds to the baseband frequency of the AM signal, and the foregoing notch filter has a gain peaking corresponding to the baseband frequency of the AM signal.

In Step 55, the second filtered signal is converted to a digital signal according to a level value to achieve demodulating the AM signal.

In conclusion, an AM demodulating circuit and an AM demodulating method according to the present disclosure attenuate a carrier signal by using a notch filter to increase a signal-to-carrier ratio, thereby reducing the number of stages of a low-pass filter. Accordingly, circuit complexity of the AM demodulating circuit is substantially reduced, such that the AM demodulating circuit is extremely applicable to an RFID system to increase a data transmission rate of the RFID system.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An amplitude modulation (AM) demodulating circuit, applied to a radio frequency identification (RFID) system, comprising:
    an envelope detector, for performing envelope detection on an AM signal modulated by a carrier frequency to generate an envelope signal;
    a notch filter, for filtering the envelope signal to suppress noise near the carrier frequency of the AM signal thereby generating a first filtered signal;
    a low-pass filter, for filtering the first filtered signal to generate a second filtered signal;
    a comparing circuit, for converting the second filtered signal to a digital signal according to a level value: and
    a bias-voltage circuit, for adjusting a bias voltage of the envelope signal to set the envelope signal within an operating voltage range of the notch filter.

2. The AM demodulating circuit as claimed in claim 1, wherein a zero point of the notch filter corresponds to the carrier frequency.

3. The AM demodulating circuit as claimed in claim 1, wherein the carrier frequency lies within a stop band of the low-pass filter.

4. The AM demodulating circuit as claimed in claim 1, wherein the AM signal is an amplitude shift keying (ASK) signal.

5. The AM demodulating circuit as claimed in claim 1, wherein the AM demodulating circuit is disposed in a Radio Frequency ID (RFID) receiver, and the AM signal is an RFID signal.

6. The AM demodulating circuit as claimed in claim 1, wherein a baseband frequency corresponding to the envelope signal lies within a pass band of the notch filter.

7. The AM demodulating circuit as claimed in claim 1, wherein the low-pass filter has a gain value to amplify baseband frequency components of the first filtered signal, wherein a cutoff frequency of the low-pass filter corresponds to a baseband frequency of the AM signal, and wherein the notch filter has a gain peaking corresponding to the baseband frequency.

8. The AM demodulating circuit as claimed in claim 1, wherein the bias-voltage circuit comprises an alternating current (AC) coupler, for removing DC components of the envelope signal.

9. An AM demodulating method, applied to an RFID system, comprising:
    performing envelope detection on an AM signal modulated by a carrier frequency to generate an envelope signal;
    filtering the envelope signal in notch manner to suppress noise near the carrier frequency of the AM signal, thereby generating a first filtered signal;
    filtering the first filtered signal in low-pass manner to generate a second filtered signal;
    converting the second filtered signal to a digital signal according to a level value: and
    adjusting a bias voltage of the envelope signal before the notch filtering to set the envelope signal within an operating voltage range of the notch filter.

10. The method as claimed in claim 9, wherein the AM signal is an amplitude shift keying (ASK) signal.

11. The method as claimed in claim 9, wherein the AM signal is a Radio Frequency ID (RFID) signal.

12. The method as claimed in claim 9, wherein the carrier frequency of the envelope signal corresponds to a zero point of the notch filtering, and a baseband frequency corresponding to the envelope signal lies within a pass band of the notch filtering.

13. The method as claimed in claim 9, wherein the low-pass filtering process has a gain value to amplify baseband frequency components of the first filtered signal, wherein a cutoff frequency of the low-pass filtering process corresponds to a baseband frequency of the AM signal, and wherein the notch filtering has a gain peaking corresponding to the baseband frequency.

14. The method as claimed in claim 9, wherein the step of adjusting the bias voltage of the envelope signal comprises removing DC components of the envelope signal.

* * * * *